United States Patent
Pedersen

(10) Patent No.: US 6,185,725 B1
(45) Date of Patent: Feb. 6, 2001

(54) APPARATUS AND METHOD FOR PARTITIONING LOGIC INTO A PROGRAMMABLE LOGIC DEVICE

(75) Inventor: Bruce Pedersen, San Jose, CA (US)

(73) Assignee: Altera Corporation, San Jose, CA (US)

(*) Notice: Under 35 U.S.C. 154(b), the term of this patent shall be extended for 0 days.

(21) Appl. No.: 09/057,084

(22) Filed: Apr. 8, 1998

Related U.S. Application Data

(60) Provisional application No. 60/043,476, filed on Apr. 11, 1997.

(51) Int. Cl.[7] ........................................ G06F 17/50
(52) U.S. Cl. .......................... 716/17; 716/16; 716/7; 716/18
(58) Field of Search .................... 395/500.18, 500.19, 395/500.08; 716/17, 18, 7, 16

(56) References Cited

U.S. PATENT DOCUMENTS

| | | | |
|---|---|---|---|
| 5,455,775 | * 10/1995 | Huber et al. ........................ 716/7 |
| 5,475,830 | * 12/1995 | Chen et al. ........................ 716/16 |
| 5,519,629 | * 5/1996 | Snider ............................... 716/17 |
| 5,742,181 | * 4/1998 | Rush ................................. 326/41 |
| 5,933,356 | * 8/1999 | Rostoker et al. ................. 703/15 |

* cited by examiner

Primary Examiner—Paul R. Lintz
Assistant Examiner—Vuthe Siek
(74) Attorney, Agent, or Firm—William S. Galliani; Pennie & Edmonds LLP

(57) ABSTRACT

A method of partitioning logic into a programmable logic device includes the steps of synthesizing a logic design into a network of hierarchical components. Each hierarchical component is then mapped to a minimum number of logic array blocks in a programmable logic device. The mapping operation may be performed by independently synthesizing the hierarchical components into a network of virtual logic elements, assigning the virtual logic elements to virtual logic array blocks, and mapping the virtual logic array blocks to the logic array blocks in the programmable logic device.

7 Claims, 5 Drawing Sheets

APPARATUS AND METHOD FOR PARTITIONING LOGIC INTO A PROGRAMMABLE LOGIC DEVICE

This application claims priority to the provisional patent application entitled "Apparatus and Method for Partitioning Logic into a Programmable Logic Device", filed Apr. 11, 1997, Ser. No. 60/043,476.

BRIEF DESCRIPTION OF THE INVENTION

This invention relates generally to the process of implementing logic in programmable logic devices. More particularly, this invention relates to a technique of partitioning logic into a programmable logic device.

BACKGROUND OF THE INVENTION

FIG. 1 illustrates a programmable logic device 20 composed of logic array blocks 22. Horizontally aligned logic array blocks 22 form logic array block rows 23. Each logic array block 22 consists of a group of logic elements 24.

Around the periphery of the programmable logic device 20 are input/output nodes 26. Each logic element 24 and input/output node 26 can generate one or more signals that can be routed to other logic elements 24 or input/output nodes 26 through column interconnect circuitry 28 and row interconnect circuitry 30.

FIG. 2 is a more detailed view of a logic array block 22. The figure illustrates a set of logic elements 24. Local interconnect circuitry 31 routes signals generated within the logic array block 22 (or signals generated externally to the logic array block which have been routed to this logic array block) to the logic elements 24 within that logic array block.

Each row of logic array blocks 23 has associated row interconnect circuitry 30 that can route signals between the different logic array blocks in a row. The column interconnect circuitry 28 operates in a similar manner to route signals between different logic array blocks in a column.

A logic design is a description of a logic circuit that can be implemented with a programmable logic device. A logic design typically consists of a collection of logic components and input/output pins that connect together through input and output ports. Large logic designs will typically be described in a hierarchical fashion, where some of the logic components represent other logic "subdesigns". For example, FIG. 3 illustrates a hierarchical logic design 32. The hierarchical logic design 32 includes element A:1, which includes: input/output ports 33, logic gate 35, and hierarchical components B:1, B:2, and D:1. Hierarchical component B:1 includes component C:1, hierarchical component B:2 includes component C:2, and hierarchical component D:1 includes components E:1 and E:2.

FIG. 4 illustrates a partially flattened hierarchical design 36 corresponding to FIG. 3. Observe in FIG. 4 that hierarchical component B:1 has been flattened such that it does not include hierarchical component C:1. Similarly, hierarchical component B:2 is flattened such that it does not include hierarchical component C:2.

Hierarchical logic designs of the type shown in FIGS. 3 and 4 can be specified with a number of well-known entry mechanisms, such as graphical schematic entry or textual design entry (such as using the VHDL language).

When implementing a logic design in a programmable logic device, the logic design is typically synthesized into a completely flattened (non-hierarchical) network of virtual logic elements. FIG. 5 illustrates a fully flattened hierarchical design corresponding to the design of FIGS. 3 and 4. The synthesized virtual logic elements are assigned to physical logic elements 24 of a programmable logic device 20. Such an assignment is called a partitioning. Thus, partitioning refers to a process of converting a logic design to individual logical elements 24 of a programmable logic device 20 that are used to implement the logic design.

To satisfy the routing requirements of the device, a partitioning must observe the maximum number of signals that are allowed to enter or leave each logic array block 22 or each logic array block row 23. A partitioning that minimizes the routing requirements in the device is considered superior to one that does not.

In the prior art, if a change is made to one of the hierarchical components of a design, say hierarchical component B1 of FIG. 3, the entire design has to be resynthesized and re-partitioned. Alternatively, the design software can re-synthesize only those logic elements that are affected by changes to the logic design and only re-partition those logic elements that were subsequently added or altered. Unfortunately, re-partitioning only those logic elements that were altered can lead to an inferior partitioning, or in a worse case, an unsuccessful partitioning. Unsuccessful partitioning occurs when the modified logic changes the routing requirements of the unmodified logic elements, the modified logic makes demands upon routing resource pools that are shared with the unmodified logic element, or when the modified virtual logic elements cannot be assigned to their preferred logic elements because the logic elements have been previously assigned to some of the unmodified virtual logic elements.

In view of the foregoing, it would be highly desirable to provide an improved technique for partitioning a logic design into a programmable logic device.

SUMMARY OF THE INVENTION

A method of partitioning logic into a programmable logic device includes the steps of synthesizing a logic design into a network of hierarchical components. Each hierarchical component is then mapped to a minimum number of logic array blocks in a programmable logic device. The mapping operation may be performed by independently synthesizing the hierarchical components into a network of virtual logic elements, assigning the virtual logic elements to virtual logic array blocks, and mapping the virtual logic array blocks to the logic array blocks in the programmable logic device.

The technique of the invention improves partitioning, aids in the incremental re-repartitioning of logic, and improves the consistency of logic delays within similar hierarchical components.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 6:
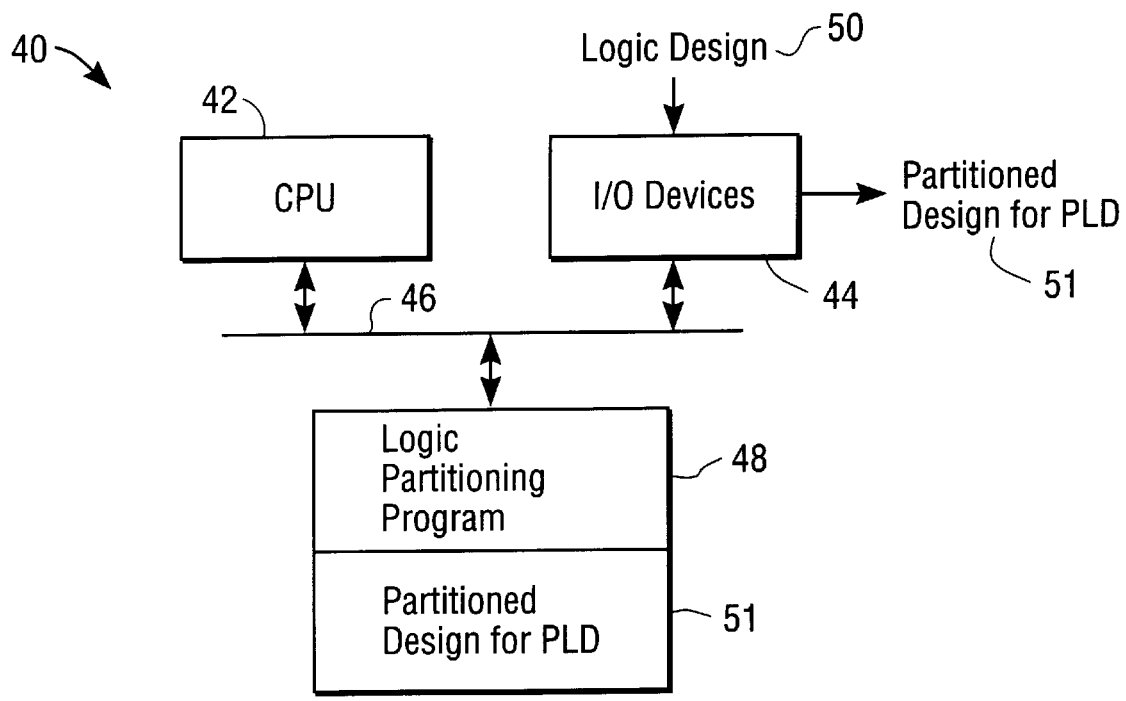
FIG. 6 illustrates an apparatus that may be used to practice the invention.

FIG. 6 illustrates a computer 40 that may be used to practice the present invention. The computer 40 includes a Central Processing Unit (CPU) 42 which communicates with a set of input/output devices 44 over a bus 46. The input/output devices include standard components, such as a keyboard, mouse, scanner, monitor, printer, etc. The CPU 42 also communicates with a memory 48, which stores a logic partitioning program 48 in accordance with the invention. A logic design 50 is passed to the input/output devices 44. The logic design 50 may be in the form of a graphical schematic, a VHDL description, etc. The logic design 50 is then processed by the logic partitioning program 48 to produce a partitioned design for a programmable logic device 51. The partitioned design 51 may be passed through the input/output devices 44 so that it can be implemented into a programmable logic device using standard techniques.

Figure 1:
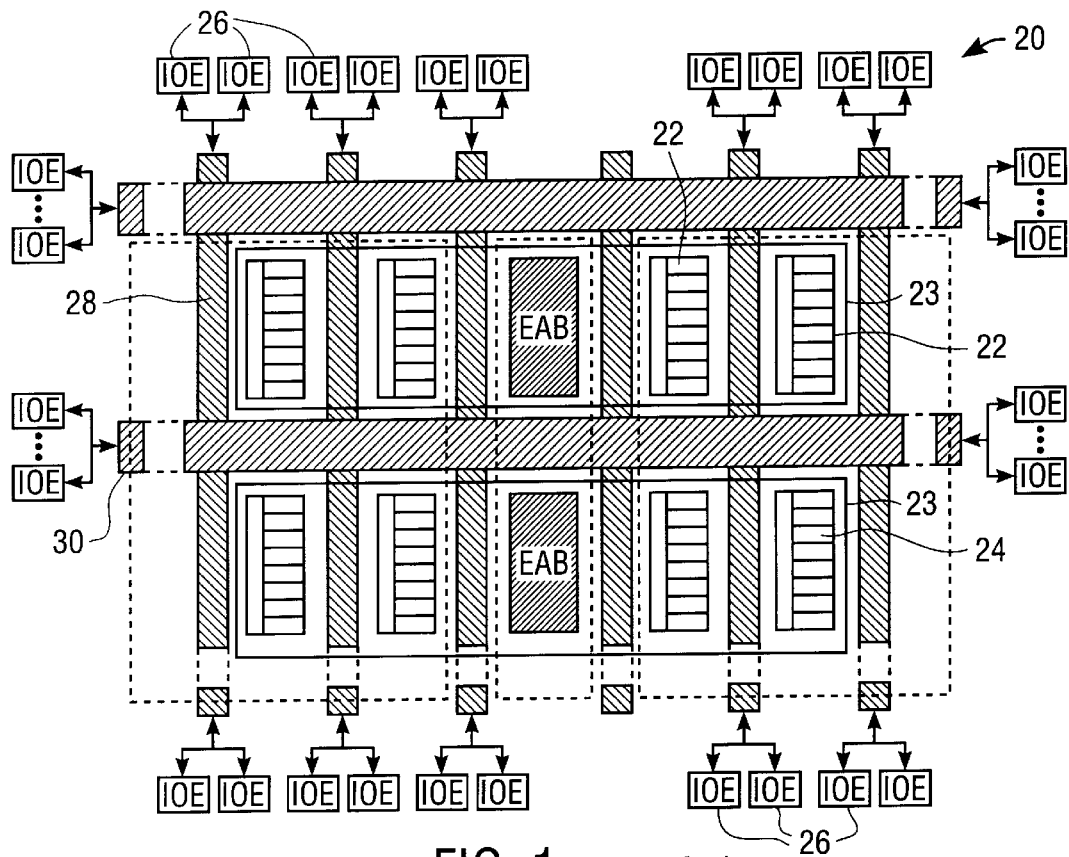
FIG. 1 illustrates a prior art programmable logic device that may be programmed in accordance with the invention.
Figure 2:
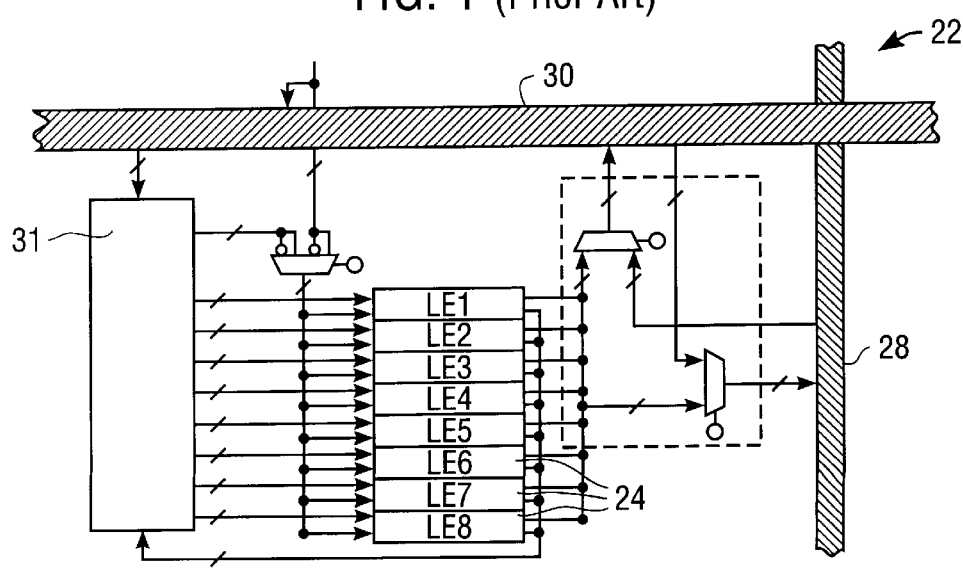
FIG. 2 illustrates a programmable logic block and associated logic elements of the programmable logic device of FIG. 1.
Figure 3:
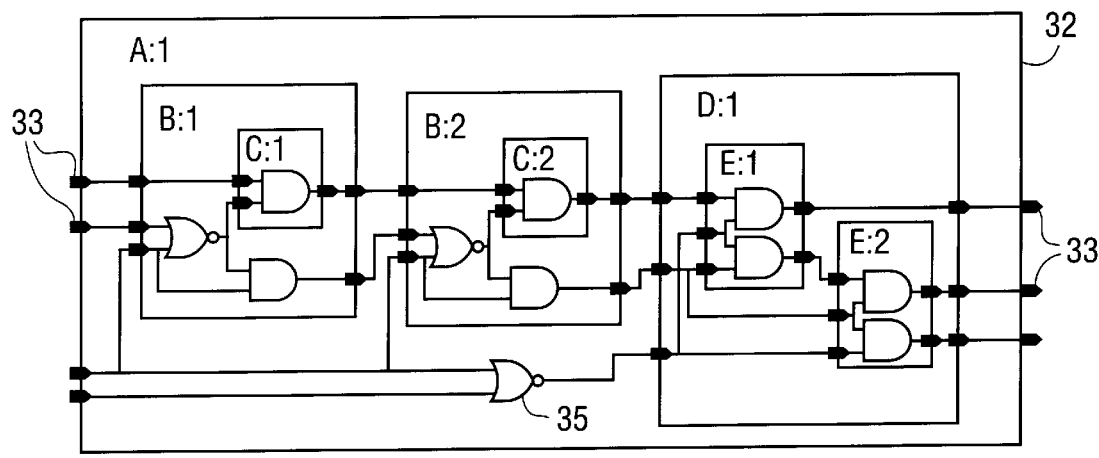
FIG. 3 illustrates a hierarchical logic design.
Figure 4:
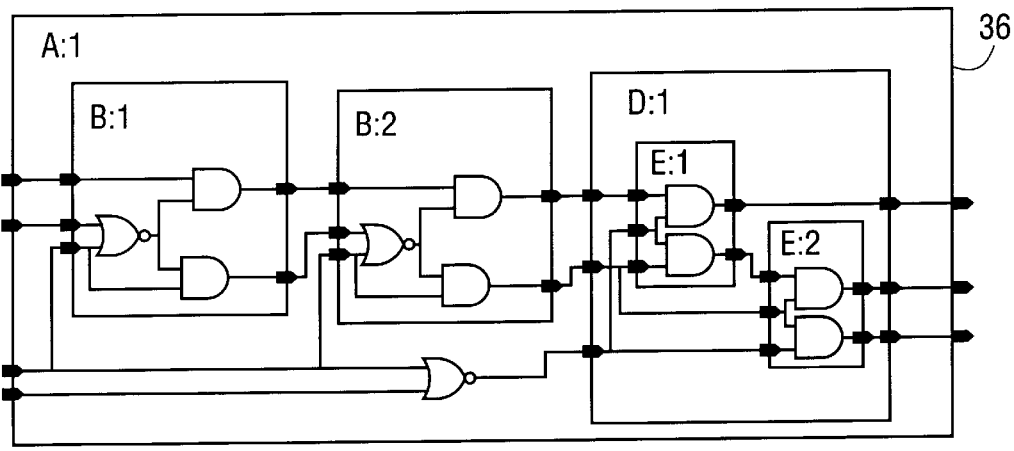
FIG. 4 illustrates a partially flattened hierarchical logic design.
Figure 7:
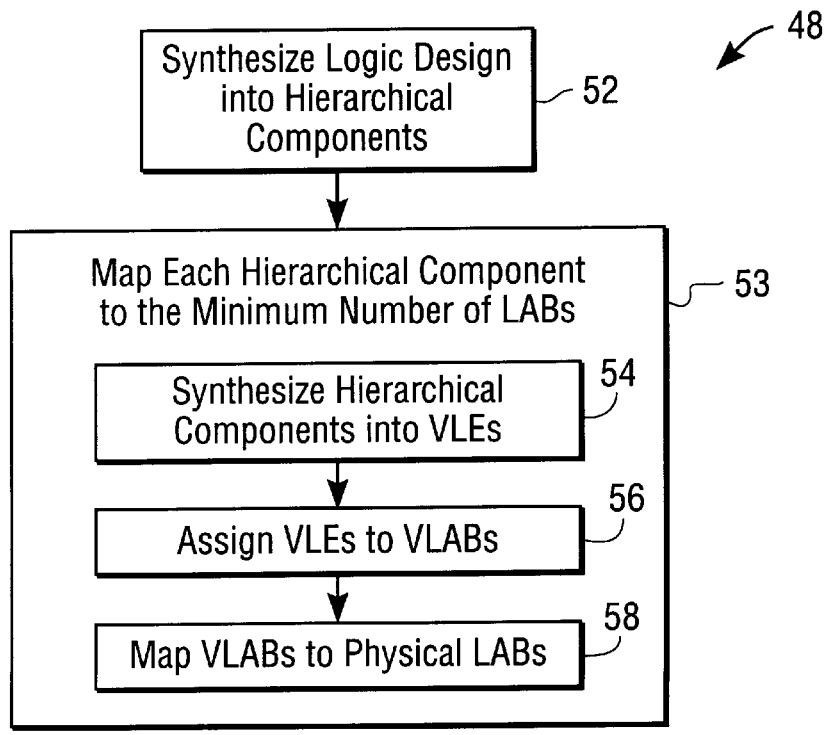
FIG. 7 illustrates processing steps associated with-an embodiment of the invention.

FIG. 7 illustrates processing steps associated with on embodiment of the logic partitioning program 48 of the invention. FIG. 7 illustrates that the first processing step is to synthesize the logic design into hierarchical components (step 52). The second processing step is to map each hierarchical component to the minimum number of logic array blocks (step 53). The prior art did not map hierarchical components to logic array blocks, rather the prior art mapped flattened components to logic array blocks. Some hierarchical components can be selectively flattened, in accordance with the invention, as long as this does not result in an excessive number of logical components in any of the -remaining unflattened hierarchical components. For example, the flattening of the design of FIG. 3 into the design of FIG. 4 is acceptable because it does not result in an excessive number of logical components in any of the remaining unflattened hierarchical components.

The mapping of each hierarchical component to the "minimum" number of logic array blocks means that each hierarchical component is preferably mapped to the smallest number of logic array blocks required to implement the component. Design and routing considerations may sometimes prevent a mapping to the absolute smallest number of logic array blocks possible. Nevertheless, the present invention endeavors to use as few logic array blocks as possible.

The mapping operation (step 53) may be implemented as follows. The hierarchical components may be synthesized into virtual logic elements (step 54). The virtual logic elements are then assigned to virtual logic array blocks (step 56). The virtual logic array blocks are then mapped to physical logic array blocks of a programmable logic device (step 58).

When the network of virtual logic elements is synthesized, the output ports of the hierarchical components become the outputs of the virtual logic elements. Each of the hierarchical collections of virtual logic elements is independently partitioned into collections of virtual logic array blocks. If a hierarchical collection of virtual logical elements is large, the collection of virtual logic array blocks may be further partitioned into a collection of virtual logic array block rows. For the purpose of this partitioning, every input and output port of the hierarchical component is assumed to contribute to the number of signals entering or leaving each virtual logic array block or virtual logic array block row. Once this is complete, each virtual logic array block or virtual row is assigned to a corresponding physical logic array block 22 or logic array block row 23 in the PLD 20. The virtual elements operate as a mapping structure for the ultimate mapping to the corresponding physical elements.

Figure 8:
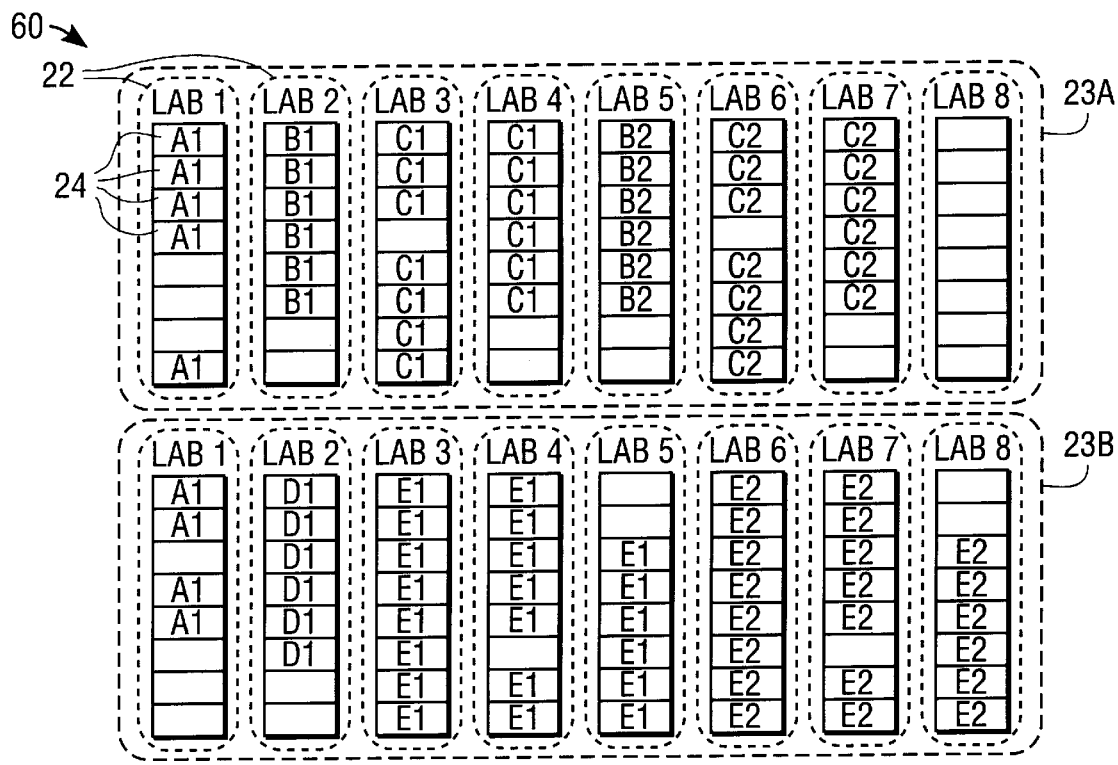
FIG. 8 illustrates logic array block hierarchical partitioning in accordance with the invention.
Figure 9:
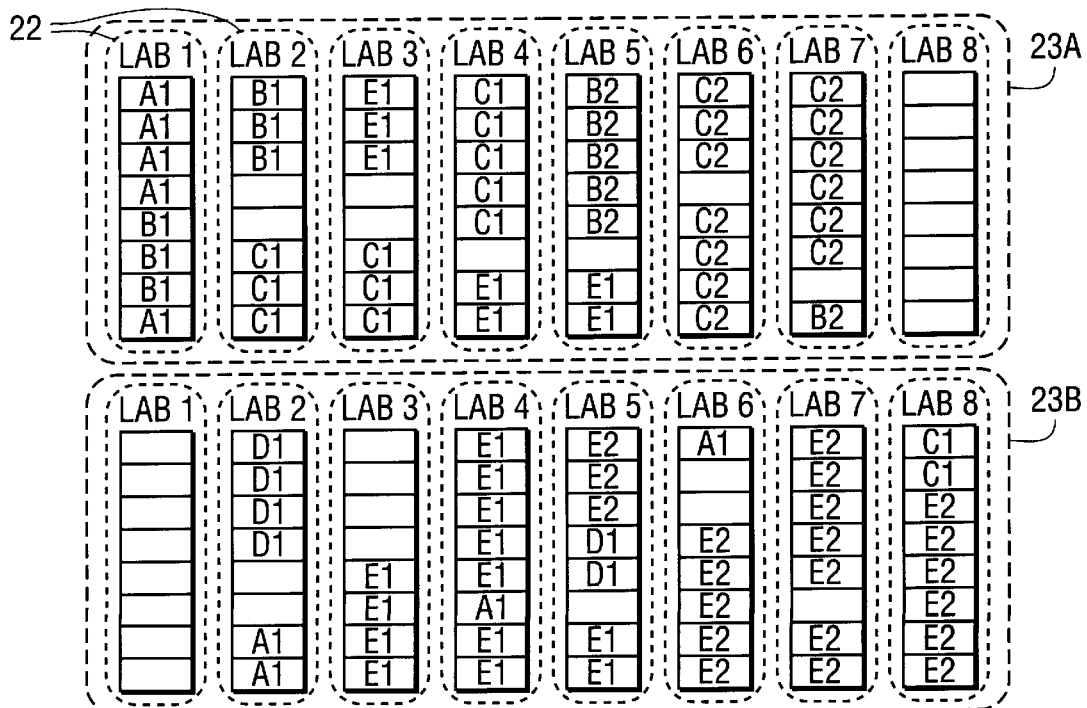
FIG. 9 illustrates logic array block non-hierarchical partitioning in accordance with the prior art.

This process results in a partitioning such that any change to a hierarchical component will affect the smallest number of logic array blocks and logic array block rows possible. The logic elements from a hierarchical component will be packed tightly into a small number of logic array blocks, instead of possibly being scattered over a large number of logic array blocks and logic array block rows. FIGS. 8–9 illustrate this concept.

FIG. 8 illustrates a first set of logic array blocks 22 forming a first logic array block row 23A and a second set of logic array blocks 22 forming a second logic array block row 23B. The hierarchical design of FIG. 3 is mapped into the logic array block rows in accordance with the invention. For example, observe that LAB 1 of row 23A uses five logic elements 24 to implement the hierarchical component A1. That is, the five logic elements 24 implement the connections 33 and the logical gate 35 associated with component A1. LAB2 of row 23A uses six adjacent logic elements 24 to implement the hierarchical component B1.

Figure 5:
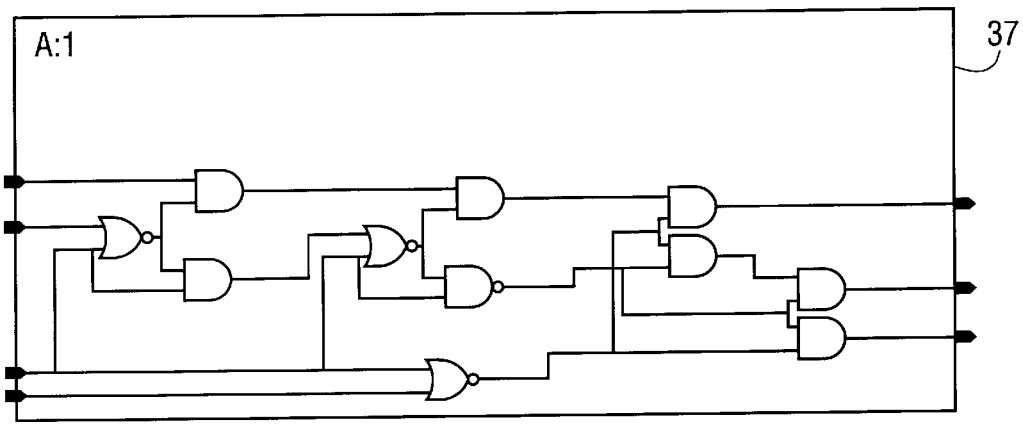
FIG. 5 illustrates a fully flattened hierarchical logic design.

FIG. 9 illustrates a prior art mapping of the flattened design of FIG. 5. That is, FIG. 9 illustrates how the equivalent hierarchical components shown in FIG. 3 are distributed in the logical array block rows 23A and 23B using prior art flattened design mapping techniques. Observe that in the prior art mapping of FIG. 9, the component B1 is mapped to LAB1 and LAB2 of row 23A. This stands in contrast to the efficient mapping achieved by the invention wherein the B1 component is implemented in six adjacent logic elements of a single logic array block (LAB2), as shown in FIG. 8.

Similarly, in accordance with the invention, the component C1 is efficiently mapped into logic array blocks LAB3 and LAB4 in row 23A of FIG. 8, while the same component is mapped, in accordance with the prior art, over three logic array blocks LAB2, LAB3, and LAB4 of row 23A in FIG. 9. Similar mapping efficiencies for the remaining components are appreciated via a comparison of FIGS. 8 and 9.

Those skilled in the art will recognize a number of benefits associated with the technique of the invention. First, if the logic within a hierarchical component should change, only those logic array blocks into which it is was previously partitioned need to be re-partitioned. Relying upon the previous example, if hierarchical component B1 of FIG. 8 needs to be re-partitioned, only logic array block LAB2 may need to be processed. On the other hand, in the case of the mapping of FIG. 9, two logic array blocks LAB1 and LAB2 may need to be processed.

Occasionally, it may help the routing of the device if elements of two different hierarchical components can be placed in the same logic array block or row. This can be achieved by packing hierarchical components into partially populated virtual logic array blocks or partially populated rows. This allows multiple virtual logic array blocks to be placed in the same physical logic array block even if the virtual logic array blocks are from different hierarchical components.

Since a designer typically chooses hierarchical components in away that minimizes the number of input and output ports of each component, this hierarchical partitioning method has the added benefit of typically minimizing the routing resources required in the programmable logic device. This is because the number of input and output signals from each logic array block or row will be limited by the number of input and output ports of the hierarchical component implemented in that logic array block or row.

Often, a hierarchical component will be instantiated multiple times in the same design. In the prior art, these various instantiating may each have been synthesized or partitioned differently, resulting in different signal delays for each instantiation. The technique of the invention results in more consistent partitioning, which results in the added benefit of preventing variations in signal delays caused by synthesis and routing delay differences.

Figure 10:
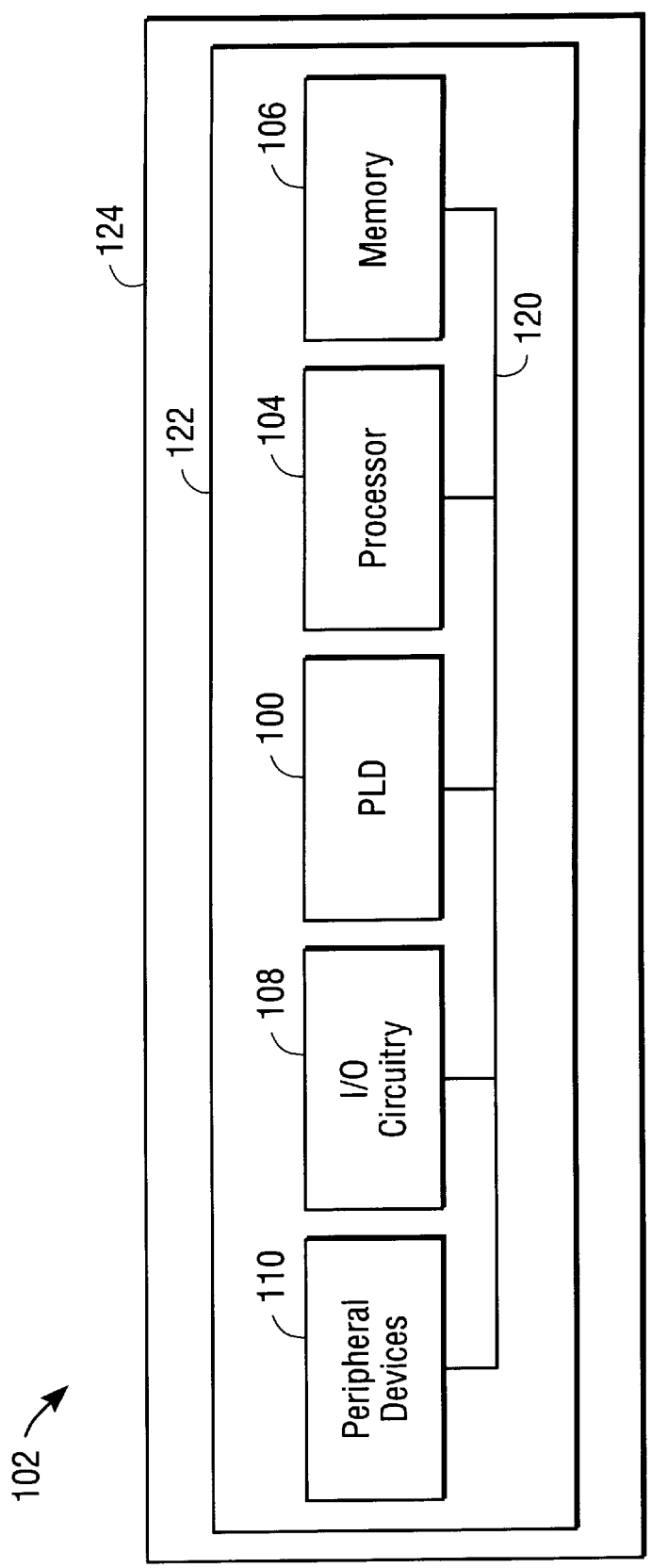
FIG. 10 illustrates a programmable logic device configured in accordance with the invention forming a part a larger digital system.

FIG. 10 illustrates a programmable logic device (PLD) 100 constructed according to the method of the invention. The PLD 100 forms a part of a data processing system 102. The data processing system 102 may include one or more of the following components: a processor 104, a memory 106, input/output circuitry 108, and peripheral devices 110. These components are coupled together by a system bus 120 and are populated on a circuit board 122, which is contained in an end-user system 124.

The system 102 can be used in a wide variety of applications, such as computer networking, data networking, instrumentation, video processing, digital signal processing, or any other application where the advantage of using reprogrammable logic is desirable. The PLD 100 can be used to perform a variety of logic functions. For example, the PLD 100 can be configured as a processor or controller that works in cooperation with processor 104. The PLD 100 may also be used as an arbiter for arbitrating access to a shared resource in the system 102. In yet another example, the PLD 100 can be configured as an interface between the processor 104 and one of the other components in the system 102.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be define by the following Claims and their equivalents.

What is claimed is:

1. A method of partitioning a logic design into a programmable logic device, said method comprising the steps of:

forming a network of hierarchical components for implementation within physical logic array blocks of a programmable logic device;

synthesizing said hierarchical components into a network of virtual logic elements;

assigning said virtual logic elements to virtual logic array blocks; and mapping said virtual logic array blocks to said physical logic array blocks of said programmable logic device.

2. The method of claim 1 further comprising the step of incrementally re-partitioning a single hierarchical component in a single logic array block.

3. The method of claim 1 wherein said mapping step includes the step of mapping multiple virtual logic array blocks to a single physical logic array block.

4. A programmable logic device constructed according to the method of claim 1.

5. A computer readable memory to direct a computer to function in a specified manner, comprising:

executable instructions to form a network of hierarchical components for implementation within physical logic array blocks of a programmable logic device;

executable instructions to synthesize said hierarchical components into a network of virtual logic elements;

executable instructions to assign said virtual logic elements to virtual logic array blocks; and executable instructions to map said virtual logic array blocks to said physical logic array blocks of said programmable logic device.

6. The computer readable memory of claim 5 further comprising executable instructions to incrementally re-partition a single hierarchical component in a single logic array block.

7. The computer readable memory of claim 5 further comprising executable instructions to map multiple virtual logic array blocks to a single physical logic array block.

* * * * *